United States Patent
Tomita et al.

(10) Patent No.: US 10,424,951 B2
(45) Date of Patent: Sep. 24, 2019

(54) ARC DETECTION APPARATUS

(71) Applicant: OMRON Corporation, Kyoto-shi, Kyoto (JP)

(72) Inventors: Kohei Tomita, Kyoto (JP); Akihiko Sano, Uji (JP)

(73) Assignee: OMRON Corporation, Kyoto-shi (JP)

( * ) Notice: Subject to any disclaimer, the term of this patent is extended or adjusted under 35 U.S.C. 154(b) by 112 days.

(21) Appl. No.: 15/785,991

(22) Filed: Oct. 17, 2017

(65) Prior Publication Data

US 2018/0219394 A1 Aug. 2, 2018

(30) Foreign Application Priority Data

Jan. 31, 2017 (JP) .................................. 2017-016234

(51) Int. Cl.
| | |
|---|---|
| *H02J 7/00* | (2006.01) |
| *G01R 31/40* | (2014.01) |
| *H02H 1/00* | (2006.01) |
| *G01R 31/02* | (2006.01) |
| *H02H 7/20* | (2006.01) |
| *G01R 31/12* | (2006.01) |
| *G01R 31/14* | (2006.01) |

(52) U.S. Cl.
CPC ............ *H02J 7/0029* (2013.01); *G01R 31/02* (2013.01); *G01R 31/1227* (2013.01); *G01R 31/14* (2013.01); *G01R 31/40* (2013.01); *H02H 1/0015* (2013.01); *H02H 7/20* (2013.01); *H02J 7/0068* (2013.01); *Y02E 10/56* (2013.01)

(58) Field of Classification Search
CPC ........... H02J 3/383; H02J 3/385; H02S 50/00; H02S 50/10; H02H 1/0015
USPC .......................................................... 320/101
See application file for complete search history.

(56) References Cited

U.S. PATENT DOCUMENTS

| | | |
|---|---|---|
| 2013/0335861 A1 | 12/2013 | Laschinski et al. |
| 2014/0055900 A1 | 2/2014 | Luebke et al. |
| 2014/0195177 A1* | 7/2014 | Kang ...................... H02S 50/10 702/58 |
| 2017/0170782 A1* | 6/2017 | Yoscovich ........... H02H 1/0015 |

FOREIGN PATENT DOCUMENTS

| | | |
|---|---|---|
| JP | 2010-521720 A | 6/2010 |
| JP | 2012-510158 A | 4/2012 |
| JP | 2014-509396 A | 4/2014 |
| JP | 2017-161242 A | 9/2017 |

OTHER PUBLICATIONS

The extended European search report dated May 14, 2018 in a counterpart European patent application.

* cited by examiner

*Primary Examiner* — Paul Dinh
(74) *Attorney, Agent, or Firm* — Metrolex IP Law Group, PLLC

(57) ABSTRACT

In a solar power generation system, a solar battery string is connected to a PCS via an electric path. In the solar battery string, a plurality of solar battery units having a solar battery module and an optimizer that optimizes an output voltage of the solar battery module are connected in series. In an arc detection apparatus, capacitors form bypass current paths that bypass the optimizer, and an electric current sensor is provided on the electric path.

9 Claims, 10 Drawing Sheets

ARC DETECTION APPARATUS

CROSS-REFERENCES TO RELATED APPLICATIONS

This application claims priority to Japanese Patent Application No. 2017-016234 filed Jan. 31, 2017, the entire contents of which are incorporated herein by reference.

FIELD

The disclosure relates to an arc detection apparatus that is applied to a DC electric power system.

BACKGROUND

Solar power generation systems include a solar battery array, and the solar battery array is formed by connecting a plurality of solar battery strings in parallel, each of which is formed by connecting a plurality of solar battery modules in series. As an example, DC electric power generated on each solar battery string is converted into appropriate DC electric power and/or appropriate AC electric power by a power conditioning system (PCS).

In such solar power generation systems, there are cases where an arc is generated due to a malfunction of a circuit or the like in the system. If an arc is generated, the temperature of the portion in which the arc is generated becomes high, and there is a risk that a fire or the like will be caused. In view of this, solar power generation systems are provided with an arc detection apparatus that detects generation of an arc by an electric current sensor measuring the AC current of the arc.

In the configuration described in JP 2014-509396T, electric power generated by a solar battery (photovoltaic generator) is supplied to an inverter via a DC electric power line. An electric current sensor is provided on the DC electric power line, and whether or not an arc has been generated is detected based on an AC current measured by this electric current sensor.

JP 2014-509396T, JP 2010-521720T and JP 2012-510158T are examples of background art.

SUMMARY

In recent solar power generation systems, an optimizer that performs optimization of electric power, which was performed by the above-mentioned PCS, in units of solar battery strings or in units of solar battery modules is increasingly used in order to convert solar energy into electric power more efficiently. JP 2010-521720T and JP 2012-510158T disclose a specific configuration of such an optimizer.

However, if an arc as mentioned above is generated in a solar power generation system provided with the above-described optimizer, it is difficult for the electric current sensor to detect the AC current of the arc. This is because the above-described optimizer is provided with a DC/DC conversion circuit. The DC/DC conversion circuit converts a DC voltage by a conversion method such as chopper conversion, flyback conversion and forward conversion, but with any of the conversion methods, a coil (inductor) is included in the circuit. Accordingly, the AC component of the arc will be reduced. In addition, a capacitor is included in the circuit in order to stabilize the voltage, and the high frequency component of the AC current of the arc will flow due to the capacitor. As a result, the AC current of the arc will not flow to the electric current sensor.

Therefore, one aspect may provide an arc detection apparatus that can detect an electric arc generated in a DC electric power system such as a solar power generation system even if there is an optimizer.

In order to solve the above-described issue, an arc detection apparatus according to one aspect is applied to a DC electric power system including a load apparatus that consumes or converts DC electric power that is input to an input terminal, an electric path connected to the input terminal, and a DC electric power source string in which a plurality of DC electric power source units are connected in series, the DC electric power source units each having a DC electric power source module that generates electric power or performs charging/discharging and an optimizer that optimizes an output voltage of the DC electric power source module and supplies the optimized output voltage to the electric path. The arc detection apparatus includes a first capacitor whose one end portion is connected to one output terminal of the DC electric power source module, and whose other end portion is connected to one output terminal of the optimizer, an electric current measurement unit that measures an electric current on the electric path between the DC electric power source string and the load apparatus, and an arc determination unit that determines whether or not an arc is generated, based on a high frequency component of an AC current measured by the electric current measurement unit.

According to the above-described configuration, the DC electric power source module is connected to the load apparatus via the optimizer and the electric path, and the first capacitor forms a first bypass current path that bypasses the optimizer, and the electric current measurement unit measures an electric current on the electric path between the DC electric power source string and the load apparatus.

Therefore, even if there is the optimizer, the electric current measurement unit on the electric path can measure an AC current of an arc generated in the DC electric power source module. Accordingly, the arc detection apparatus can detect an arc generated in the DC electric power system even if there is the optimizer in the DC electric power system.

Note that the first capacitor may be provided outside of the optimizer, and may be provided inside the optimizer.

In the arc detection apparatus according to the above aspect, an impedance of the first capacitor preferably satisfies a condition that a combined impedance of the impedance of the first capacitor and an impedance of the optimizer between one input terminal and one output terminal of the optimizer is smaller than an impedance of the optimizer between input terminals of the optimizer.

In this case, an amount of an AC current that flows between output terminals of the DC electric power source module via the optimizer, the first capacitor, the electric path, and the load apparatus is greater than an amount of an AC current that flows between output terminals of the DC electric power source module via the optimizer. Therefore, an arc generated in the DC electric power system can be detected reliably.

In the arc detection apparatus according to the above aspect, a first coil may be further provided between the one end portion of the first capacitor and the one input terminal of the optimizer. In this case, the amount of an AC current that flows through the first bypass current path increases, and the amount of an AC current that flows through the electric current measurement unit increases. As a result, an arc generated in the DC electric power system can be detected accurately. Note that the first coil may be provided in the optimizer, and may be provided outside of the optimizer.

Incidentally, there are cases where impedances between the input terminals and the output terminals in the optimizer are large depending on the optimizer.

In view of this, in the arc detection apparatus according to the above aspect, a second capacitor whose one end portion is connected to the other output terminal of the DC electric power source module, and whose other end portion is connected to the other output terminal of the optimizer may be further provided.

In this case, the second capacitor forms a second bypass current path that bypasses the optimizer. Therefore, even if the impedances between the input terminals and the output terminals in the optimizer are large, the electric current measurement unit on the electric path can measure the AC current of an arc generated in the DC electric power source module. Accordingly, the arc detection apparatus can detect an arc generated in the DC electric power system, even if there is the optimizer in the DC electric power system.

In the arc detection apparatus according to the above aspect, impedances of the first capacitor and the second capacitor preferably satisfy a condition that a combined impedance of the impedances of the first capacitor and the second capacitor, the impedance of the optimizer between the one input terminal and the one output terminal of the optimizer, and an impedance of the optimizer between the other input terminal and the other output terminal of the optimizer is smaller than the impedance of the optimizer between the input terminals of the optimizer.

In this case, an amount of AC current that flows between the output terminals of the DC electric power source module via the optimizer, the first capacitor, the second capacitor, the electric path, and the load apparatus is larger than an amount of AC current that flows between the output terminals of the DC electric power source module via the optimizer. Therefore, an arc generated in the DC electric power system can be detected reliably.

In the arc detection apparatus according to the above aspect, a second coil may be further provided between the one end portion of the second capacitor and the other input terminal of the optimizer. In this case, an amount of AC current that flows through the second bypass current path increases, and an amount of AC current that flows through the electric current measurement unit increases. As a result, an arc generated in the DC electric power system can be detected accurately. Note that the second coil may be provided inside the optimizer, and may be provided outside of the optimizer.

According to one aspect, the first capacitor forms the first bypass current path that bypasses the optimizer, and thereby even if there is the optimizer in the DC electric power system, the electric current measurement unit on the electric path between the DC electric power source string and the load apparatus can measure an AC current of an arc generated in a DC electric power source, and thus the arc detection apparatus can detect an arc generated in the DC electric power system.

DETAILED DESCRIPTION

First Embodiment

One or more embodiments will be described below with reference to FIGS. 1 to 6.

Configuration of Solar Power Generation System

Figure 2:
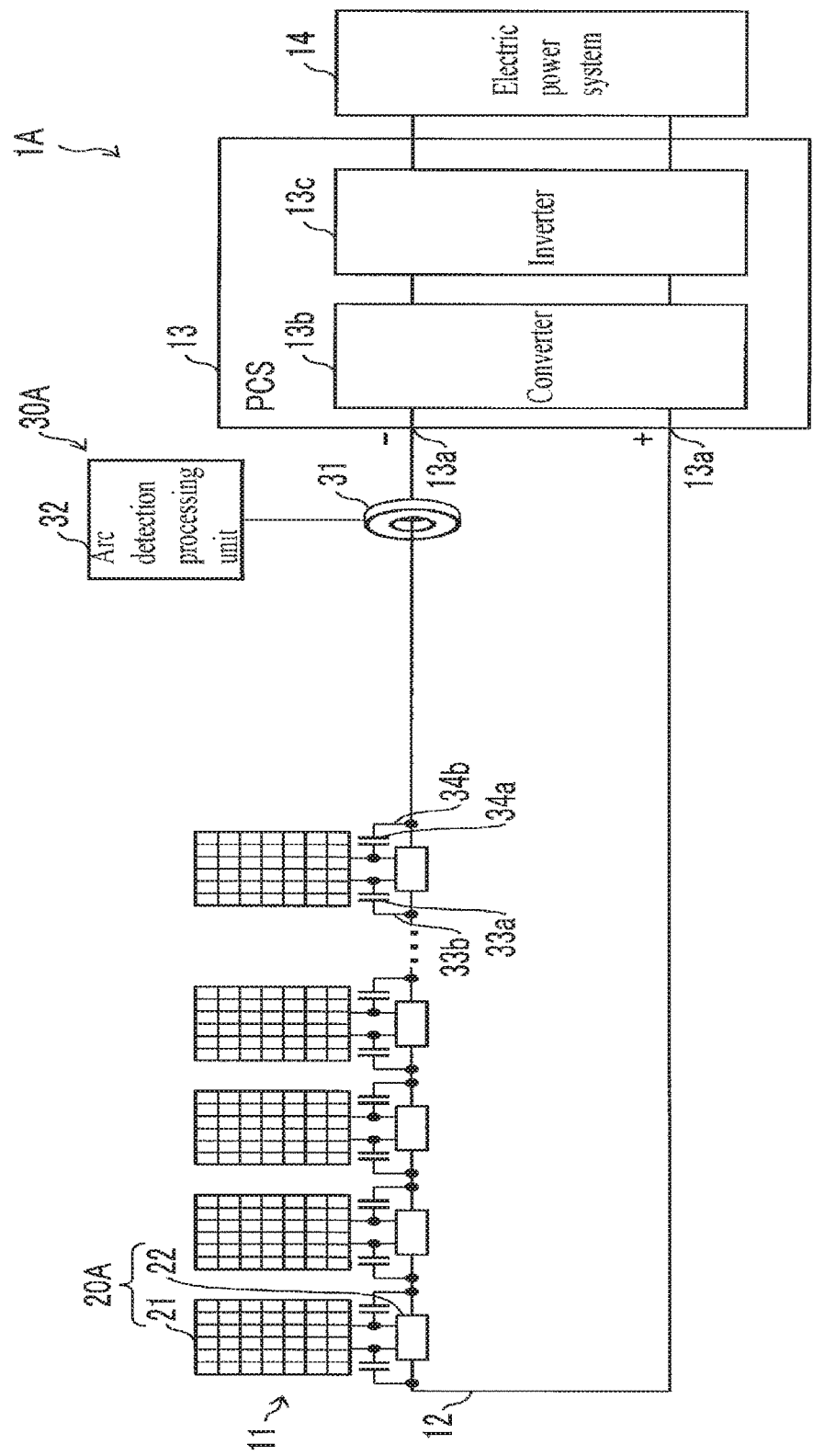
FIG. 2 is a schematic circuit diagram illustrating the configuration of a solar power generation system provided with an arc detection apparatus.

The configuration of a solar power generation system of an embodiment will be described with reference to FIG. 2. FIG. 2 is a schematic circuit diagram showing the configuration of a solar power generation system 1A (a DC electric power system) provided with an arc detection apparatus 30A.

As shown in FIG. 2, in the solar power generation system 1A of an embodiment, a solar battery string 11 serving as a DC electric power source string in which a plurality of solar battery units 20A serving as DC electric power source units are connected in series is connected to a power conditioning system (hereinafter, referred to as a PCS) 13 serving as a load apparatus. The solar battery string 11 is connected to input terminals 13a of the PCS 13 via an electric path 12. Note that, in an embodiment, description is given assuming that the number of solar battery strings 11 is one, but the present invention is not necessarily limited thereto, and a configuration is possible in which a plurality of solar battery strings 11 are provided in parallel as shown in a third embodiment to be described later.

The solar battery unit 20A is provided with a solar battery module 21 serving as a DC electric power source module and an optimizer 22 serving as a switching device. The solar battery module 21 is provided with a plurality of solar battery cells connected in series on a panel. The optimizer 22 optimizes electric power from the solar battery module 21 via an electric path, and supplies the output electric power to the electric path 12 of the solar battery string 11. This makes it possible to improve the output efficiency of electric power from the solar battery string 11 to the PCS 13. Note that the optimizer 22 will be described later in detail.

The PCS 13 converts DC electric power that has been input from the solar battery string 11 to the input terminals 13a into predetermined AC electric power, and outputs the predetermined AC electric power to an electric power system 14 as an external load apparatus. Specifically, the PCS 13 is provided with a converter 13b and an inverter 13c.

The converter 13b is a circuit that DC/DC converts DC electric power from the solar battery string 11 into predetermined DC electric power, and is a boost chopper, for example. The DC electric power acquired by the converter 13b performing the conversion is supplied to the inverter 13c.

The inverter 13c is a circuit that DC/AC converts the DC electric power supplied from the converter 13b into AC electric power of a predetermined frequency such as a frequency of 60 Hz. The AC electric power acquired by the inverter 13c performing conversion is supplied to and consumed by the external electric power system 14, which is a load apparatus.

As described above, in the solar power generation system 1A of an embodiment, by providing the PCS 13, DC electric power generated by the solar battery string 11 can be converted into AC electric power having a predetermined voltage and frequency that enable system corporation with the electric power system 14. This is not essential in one aspect.

Configuration of Optimizer

Figure 3:
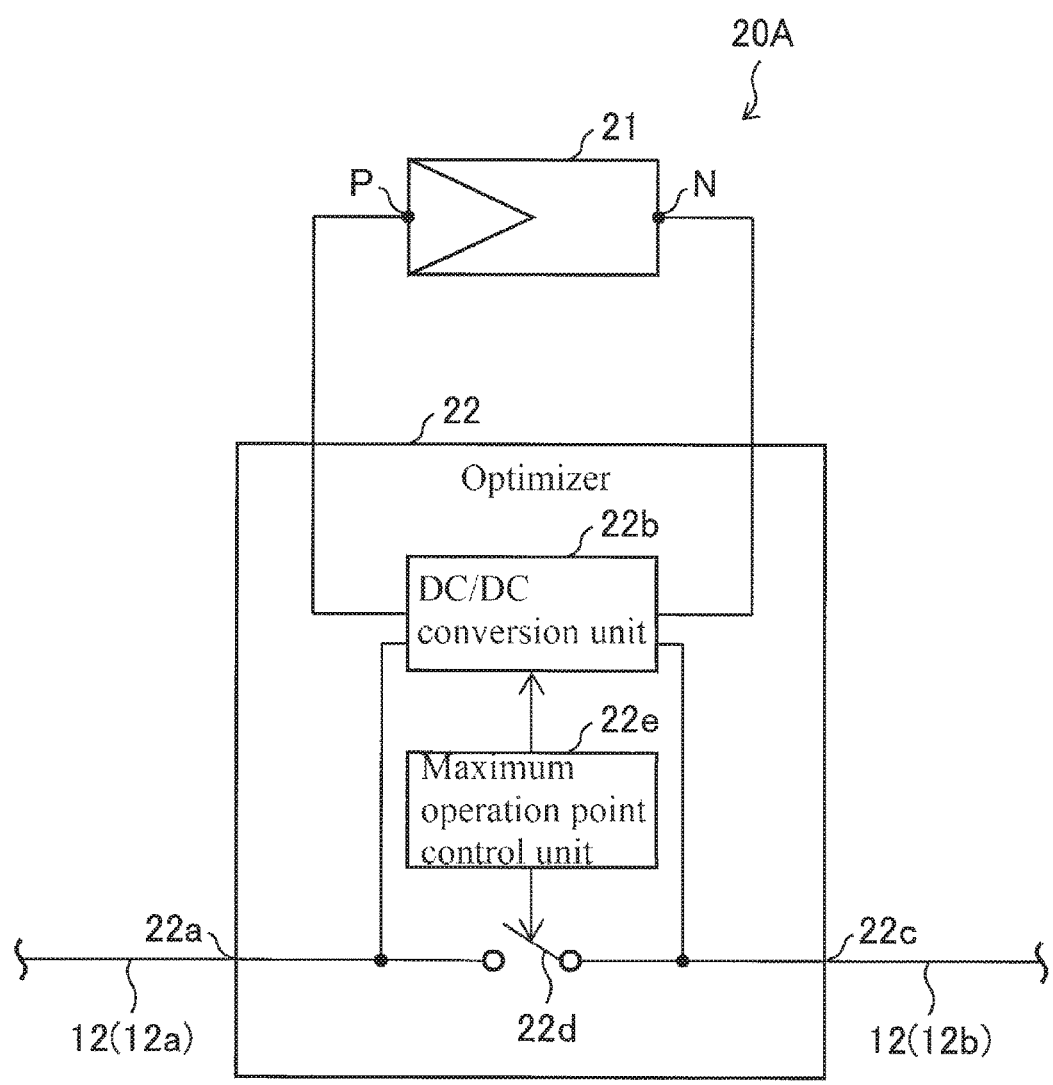
FIG. 3 is a circuit diagram illustrating the configuration of an optimizer provided in a solar power generation system.

FIG. 3 is a schematic circuit diagram showing the configuration of the optimizer 22.

As shown in FIG. 3, the optimizer 22 is provided with a first connection terminal 22a, a DC/DC conversion unit 22b provided between a path from the first connection terminal 22a to a positive terminal P of the solar battery module 21 and a path from a negative terminal N of the solar battery module 21 to a second connection terminal 22c, a first switching circuit 22d provided on a path directly connecting the first connection terminal 22a and the second connection terminal 22c, and a maximum operation point control unit 22e that controls the DC/DC conversion unit 22b and the first switching circuit 22d.

As described above, the optimizer 22 is interposed on the electric path 12, and the electric path 12 can be opened/closed inside the optimizer 22 by the first switching circuit 22d.

The DC/DC conversion unit 22b is provided with a coil, and DC/DC converts electric power that has been input from the solar battery module 21, and outputs the converted electric power to the electric path 12. At this time, the optimizer 22 causes the maximum operation point control unit 22e to perform control so as to output maximum electric power from the DC/DC conversion unit 22b.

Specifically, the maximum operation point control unit 22e causes a primary side voltage/electric current monitoring unit (not illustrated) to monitor an output voltage/an output electric current of the solar battery module 21, and performs control so as to maximize output on a secondary side of the optimizer 22, in other words, output to the electric path 12. At the time of the control, the maximum operation point control unit 22e performs control so as to open/close the first switching circuit 22d.

Operations of Optimizer

General operations in the optimizer 22 of the above configuration will be described. As described above, the optimizer 22 optimizes electric power from the solar battery module 21, and supplies the optimized electric power to the electric path 12 of the solar battery string 11. Specifically, if electric power of a predetermined threshold value or more is output from the solar battery module 21 under control of the maximum operation point control unit 22e, the optimizer 22 turns off the first switching circuit 22d. Accordingly, electric power of the predetermined threshold value or more is output from the solar battery module 21 to the electric path 12 via the DC/DC conversion unit 22b. On the other hand, if electric power of the predetermined threshold value or more is not output from the solar battery module 21 under control of the maximum operation point control unit 22e, the optimizer 22 turns on the first switching circuit 22d. Accordingly, electric power of the predetermined threshold value or more is not acquired from the solar battery module 21, and thus the first switching circuit 22d is turned on, and an electric current flows on the electric path 12 of the solar battery string 11.

As a result, the solar battery module 21 outputs, to the electric path 12, only electric power of the predetermined threshold value or more. Therefore, the optimizer 22 can optimize electric power from the solar battery module 21, and supply the optimized electric power to the electric path 12 of the solar battery string 11.

Configuration of Arc Detection Apparatus

Incidentally, in the solar power generation system 1A having the above configuration, there are cases where an arc is generated due to a malfunction of an internal circuit of the solar battery module 21, for example. If an arc is generated, the temperature of the portion in which the arc is generated becomes high, and there is a risk that a fire or the like will be caused.

In view of this, as shown in FIG. 2, the solar power generation system 1A of an embodiment is provided with the arc detection apparatus 30A that detects an arc by causing an electric current sensor 31 (an electric current measurement unit) to measure the AC current when the arc is generated.

As shown in FIG. 2, the arc detection apparatus 30A is provided with the electric current sensor 31 provided on the electric path 12 of the solar battery string 11 and an arc detection processing unit 32 (an arc determination unit).

Figure 4:
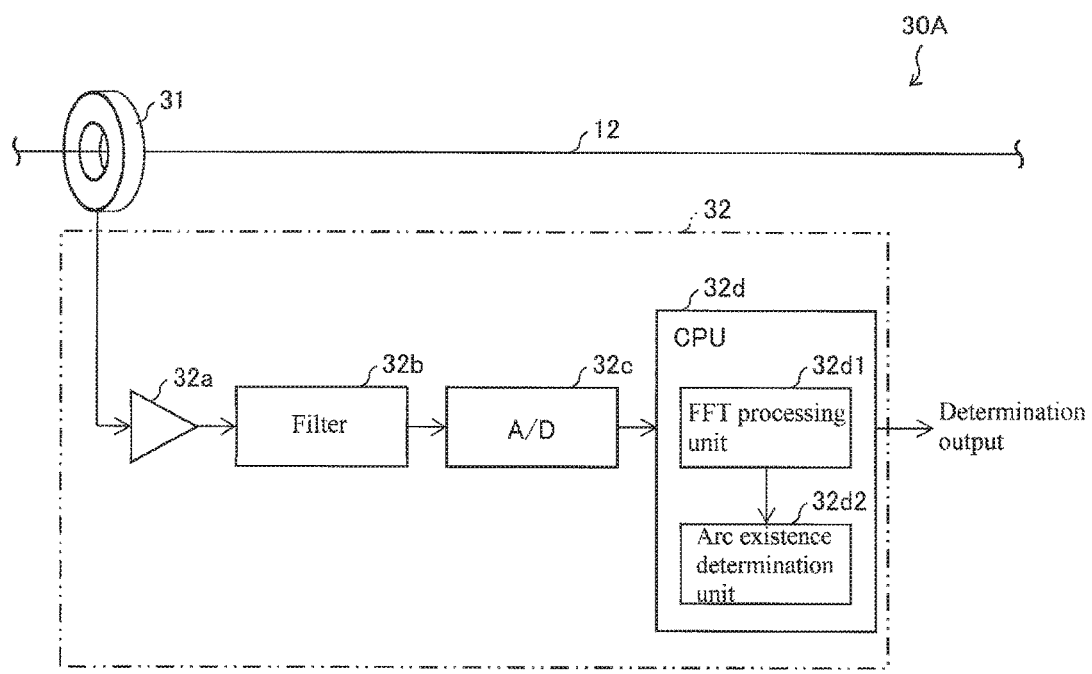
FIG. 4 is a block diagram illustrating the configuration of an arc detection processing unit in an arc detection apparatus.

FIG. 4 is a block diagram showing the configuration of the arc detection processing unit 32 of the arc detection apparatus 30A.

As shown in FIG. 4, the arc detection processing unit 32 is provided with an amplifier 32a, a filter 32b, an A/D conversion unit 32c and a CPU (central processing unit) 32d.

The amplifier 32a amplifies an electric current measured by the electric current sensor 31. The filter 32b is a band pass filter (BPF), and allows only an electric current in a predetermined frequency range out of an electric current that is output from the amplifier 32a to pass therethrough. Accordingly, an electric current of frequency components including a large amount of switching noise of the converter 13b constituted by a DC-DC converter of the PCS 13 can be excluded from an electric current that is output from the amplifier 32a. The A/D conversion unit 32c converts a signal of an analog electric current that has passed through the filter 32b into a digital signal, and inputs the digital signal to the CPU 32d.

The CPU 32d is provided with an FFT processing unit 32d1 and an arc existence determination unit 32d2. The FFT (Fast Fourier Transform) processing unit 32d1 performs Fast Fourier Transform on the digital signal of the electric current that has been input from the A/D conversion unit 32c, and generates a power spectrum of the electric current. The arc existence determination unit 32d2 determines whether or not an arc has been generated, based on the power spectrum of the electric current generated by the FFT processing unit 32d1.

Operations of Solar Power Generation System and Arc Detection Apparatus

Figure 5A:
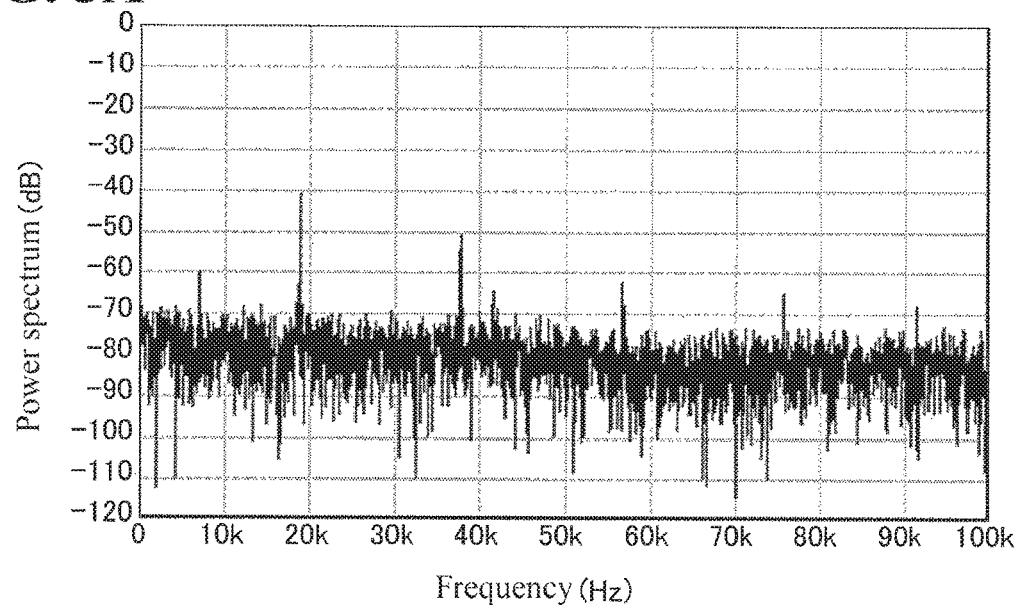
FIG. 5A is a waveform chart illustrating the waveform after FFT processing of an electric current detected by an electric current sensor when an arc is not generated in a solar power generation system.
Figure 5B:
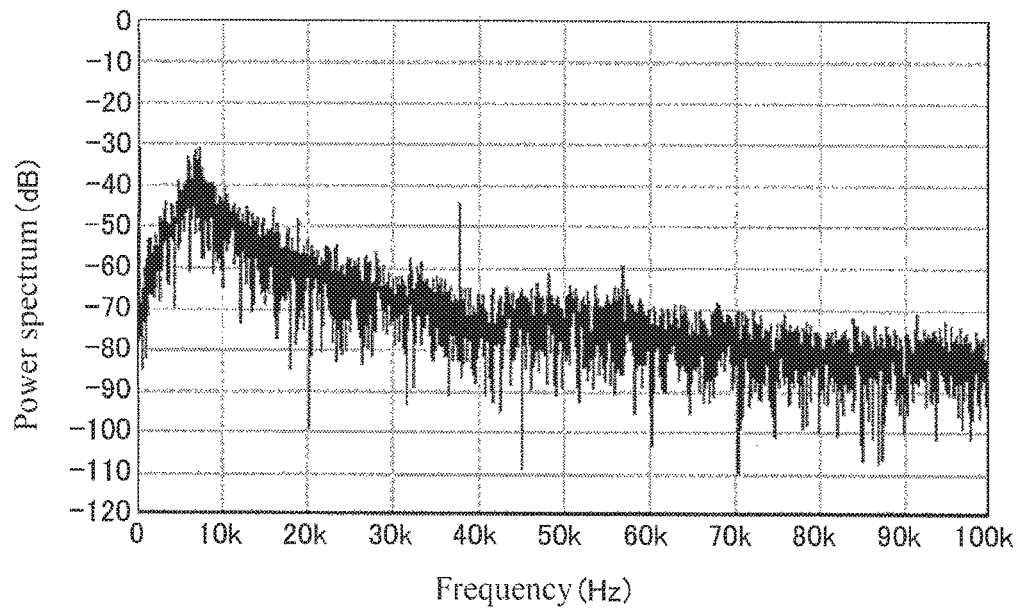
FIG. 5B is a waveform chart illustrating the waveform after FFT processing of an electric current detected by an electric current sensor when an arc is generated in a solar power generation system.

Next, operations of the solar power generation system 1A and the arc detection apparatus 30A will be described with reference to FIGS. 5A and 5B. FIG. 5A is a waveform chart showing the waveform after FFT processing of an electric current detected by the electric current sensor 31 when an arc is not generated in the solar power generation system 1A. FIG. 5B is a waveform chart showing the waveform after FFT processing of an electric current detected by the electric current sensor 31 when an arc is generated in the solar power generation system 1A.

As described above, the solar battery modules 21 of the solar battery string 11 generate DC electric power, and the electric power is input to the PCS 13 through the electric path 12. The PCS 13 converts the DC electric power that has been input into AC electric power, and outputs the AC electric power.

When the solar battery modules 21 generate DC electric power and cause the DC electric power to flow to the solar battery string 11, if disconnection or the like does not occur in the solar battery modules 21 of the solar power generation system 1A, and an arc is not generated, an electric current that is detected by the electric current sensor 31 does not include the AC current of an arc, and a waveform acquired by the FFT processing unit 32d1 performing fast Fourier transformation on this electric current will be an approximately −80 db power spectrum at all frequencies of 0 to 100 k (hz), as shown in FIG. 5A, for example.

On the other hand, when the solar battery modules 21 of the solar power generation system 1A generate DC electric power and causes the DC electric power to flow to the solar battery string 11, if an arc is generated in one of the solar battery modules 21, an electric current that is detected by the electric current sensor 31 is an electric current in which the AC component of the arc is superimposed on a DC current that is an output electric current of the solar battery string 11, and a waveform acquired by the FFT processing unit 32d1 performing fast Fourier transformation on this electric current will be an approximately −70 to −40 db power spectrum particularly at frequencies 0 to 40 k (hz), as shown in FIG. 5B, for example.

Therefore, the arc detection processing unit 32 can detect generation of an arc in the solar battery modules 21 based on the high frequency component of a signal that has been input from the electric current sensor 31.

In the solar power generation system 1A of an embodiment, the solar battery modules 21 are respectively connected in parallel to the optimizers 22, as shown in FIG. 2.

Additionally, for example, assume that, in a circuit inside the optimizer 22 shown in FIG. 3, an arc is generated in the solar battery module 21 when the first switching circuit 22d is disconnected and the solar battery module 21 supplies electric power to the electric path 12. In this case, the DC/DC conversion unit 22b of the optimizer 22 is provided with a coil (not illustrated), which does not allow a high frequency electric current to flow therethrough. As a result, even if an arch is generated in the solar battery module 21, an AC current does not flow to the electric path 12, and thus the electric current sensor 31 provided on the electric path 12 cannot detect generation of the arc in the solar battery module 21.

Figure 1:
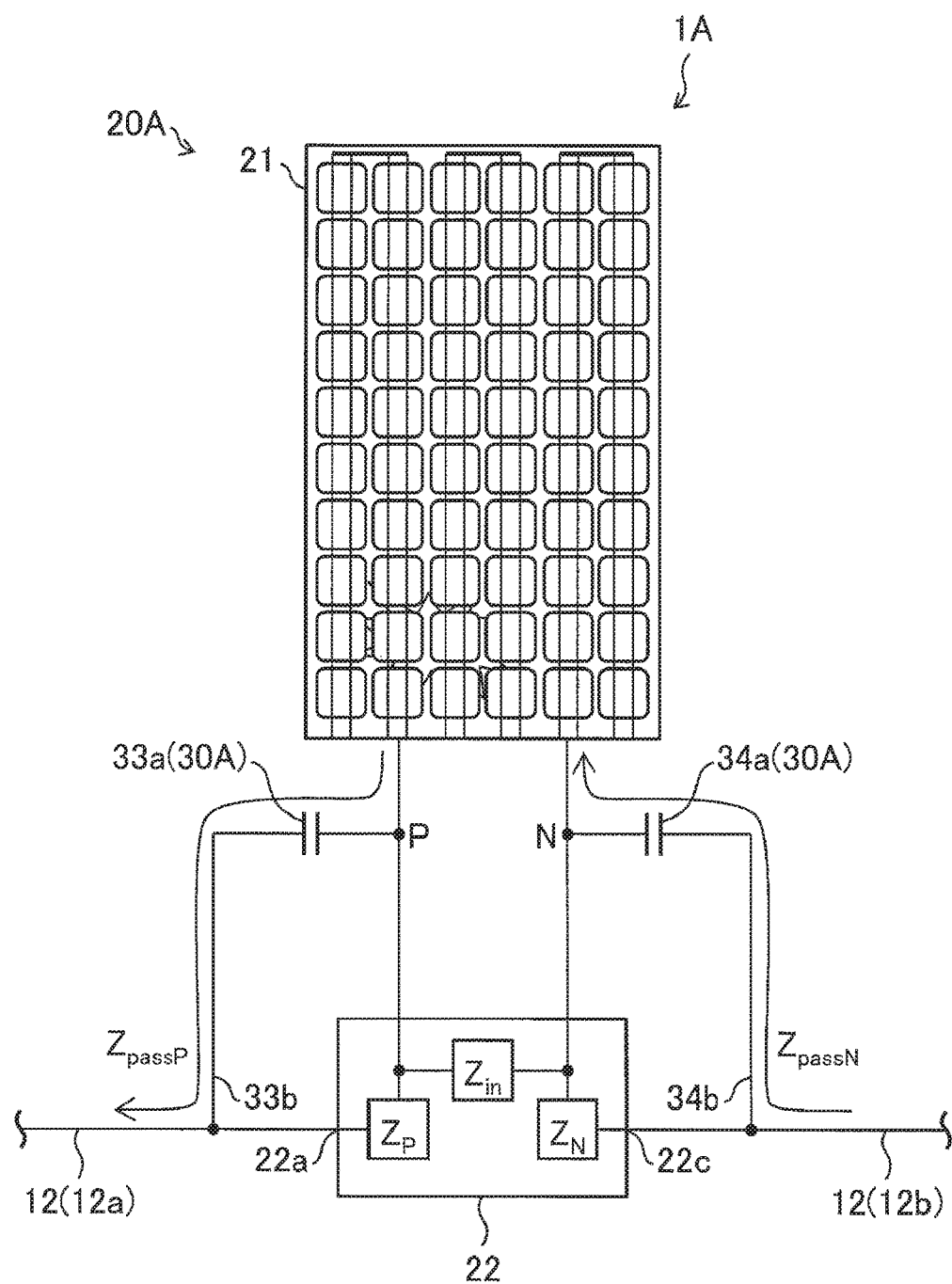
FIG. 1 is a circuit diagram illustrating an arc detection apparatus in a first embodiment, and shows a main portion of the arc detection apparatus.

As shown in FIG. 1, in view of this, in the arc detection apparatus 30A of the solar power generation system 1A of an embodiment, a positive terminal-side bypass 33b (a first bypass current path) is formed by a capacitor 33a (a first capacitor) whose one end portion is connected to the positive terminal P (an output terminal) of the solar battery module 21, and whose other end portion is connected to one electric path 12a of the electric path 12, namely, the first connection terminal 22a (an output terminal) of the optimizer 22. Also, a negative terminal-side bypass 34b (a second bypass current path) is formed by a capacitor 34a (a second capacitor) whose one end portion is connected to the negative terminal N (an output terminal) of the solar battery module 21, and whose other end portion is connected to one electric path 12b of the electric path 12, namely, the second connection terminal 22c (an output terminal) of the optimizer 22.

Therefore, even if there is the optimizer 22, the electric current sensor 31 on the electric path 12 can measure the AC current of an arc generated in the solar battery module 21. Accordingly, the arc detection apparatus 30A can detect an arc generated in the solar power generation system 1A even if there is the optimizer 22 in the solar power generation system 1A.

Note that there is the capacitor 33a in the positive terminal-side bypass 33b, the capacitor 34a is provided in the negative terminal-side bypass 34b, and the capacitors 33a and 34a do not allow a DC current to flow therethrough. As a result, extraction of optimum electric power performed by the optimizer 22 is not suppressed, due to short-circuiting between the electric path 12 and the solar battery module 21 caused by the positive terminal-side bypass 33b and the negative terminal-side bypass 34b.

Here, an impedance of the capacitor 33a, namely, an impedance of the positive terminal-side bypass 33b from the one electric path 12a to the positive terminal P of the solar battery module 21 via the capacitor 33a is denoted by $Z_{passP}$. Also, an impedance from the first connection terminal 22a in the optimizer 22 to the positive terminal P (equivalent to one input terminal of the optimizer) of the solar battery module 21 via the DC/DC conversion unit 22b is denoted by $Z_P$.

In addition, an impedance of the capacitor 34a, namely, an impedance of the negative terminal-side bypass 34b from the negative terminal N of the solar battery module 21 to the other electric path 12b via the capacitor 34a is denoted by $Z_{passN}$. Also, an impedance from the second connection terminal 22c in the optimizer 22 to the negative terminal N (equivalent to the other input terminal of the optimizer) of the solar battery module 21 via the DC/DC conversion unit 22b is denoted by $Z_N$. In addition, an impedance of the optimizer 22 between the negative terminal N and the positive terminal P of the solar battery module 21 is denoted by $Z_{in}$.

In order for the electric current sensor 31 to detect the AC current of the arc, the amount of AC current that flows from the positive terminal P to the negative terminal N via the impedance $Z_{passP}$ and the impedance $Z_P$, the electric path 12a, the PCS 13, the electric path 12b and the impedance $Z_{passN}$ and the impedance $Z_N$ is desirably larger than the amount of AC current that flows from the positive terminal P of the solar battery module 21 to the negative terminal N of the solar battery module 21 via the impedance $Z_{in}$. Accordingly, Conditional Expression 1 below is desirably satisfied.

$$\text{(combined impedance of } Z_{passP}, Z_P, Z_{passN} \text{ and } Z_N) = \{(1/Z_{passP})+(1/Z_P)\}^{-1}+\{(1/Z_{passN})+(1/Z_N)\}^{-1} \leq Z_{in} \quad 1$$

Therefore, for example, the impedances $Z_{in}$, $Z_P$ and $Z_N$ in the optimizer 22 are measured using an LCR meter, and the impedances $Z_{passP}$ and $Z_{passN}$ of the capacitors 33a and 34a can be easily determined using the result of the measurement and Conditional Expression 1 above.

Furthermore, if Conditional Expression 1 above is referenced, it can be understood that if $Z_N<Z_{in}$, the impedance $Z_{passN}$ may be any value. Therefore, if the impedance $Z_N$ is significantly smaller than the impedance $Z_{in}$, the capacitor 34a that has the impedance $Z_{passN}$ can be omitted.

Note that, in the above description, as shown in FIG. 3, the optimizer 22 is only provided with the first switching circuit 22d for opening/closing the electric path 12. However, the present invention is not necessarily limited thereto, and for example, as shown in FIG. 6, a bypass path 22g provided with a second switching circuit 22f can be provided between the first connection terminal 22a and the positive terminal P of the solar battery module 21.

Figure 6:
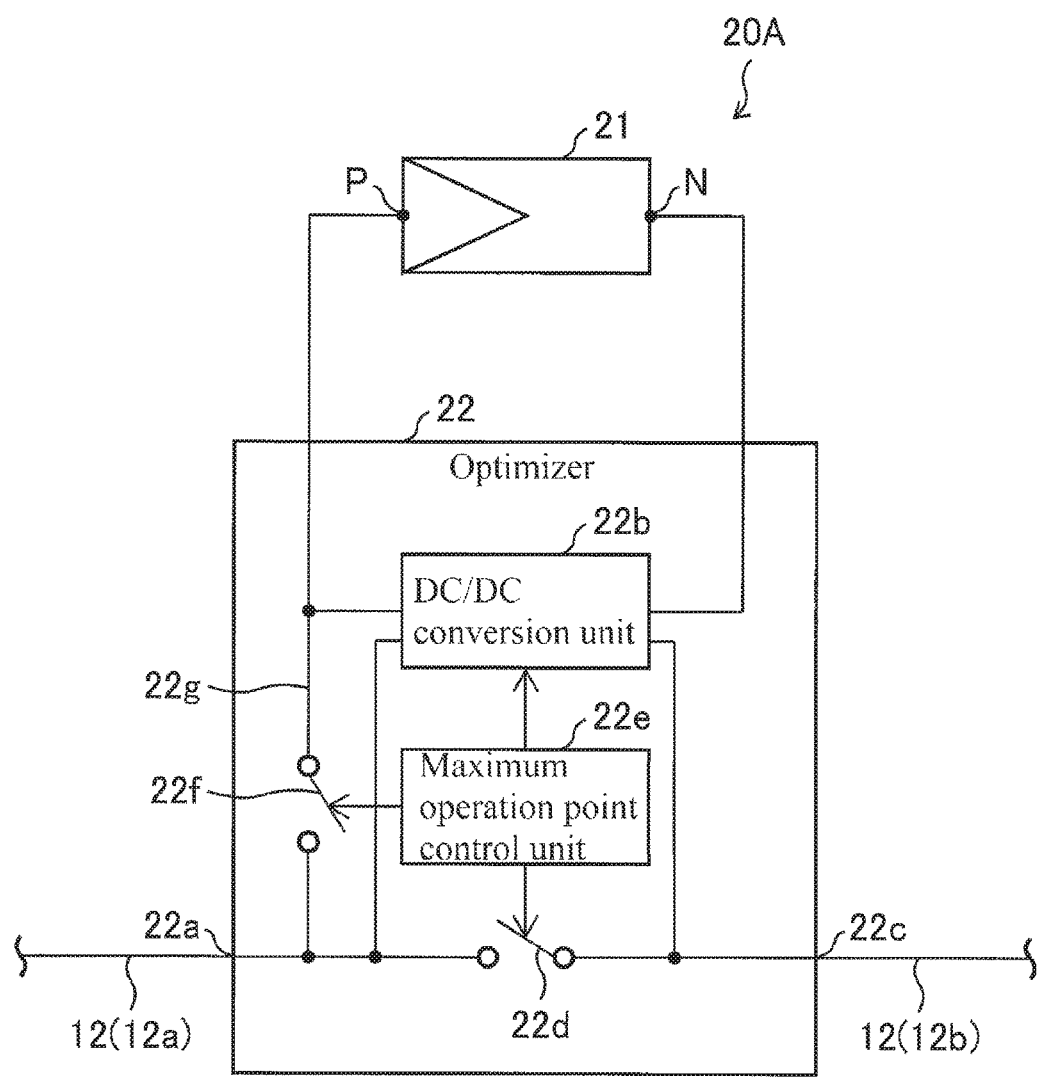
FIG. 6 is a circuit diagram illustrating the configuration of a modified example of an optimizer provided in a solar power generation system.

FIG. 6 is a circuit diagram showing the configuration of a modified example of the optimizer 22 of an embodiment.

In the optimizer 22 shown in FIG. 6, the maximum operation point control unit 22e performs control so as to open/close the second switching circuit 22f.

Accordingly, DC/DC conversion performed by the DC/DC conversion unit 22b is accompanied by a loss in electric power. Thus, if sufficient output is acquired from the solar battery module 21 to an extent to which DC/DC conversion does not need to be performed, it is preferable not to perform DC/DC conversion from the viewpoint of the power generation efficiency of the solar power generation system 1A. The reason for this is that if output from the solar battery module 21 is DC/DC converted, output loss is caused by the DC/DC conversion, and as a result, there are cases where output of the optimizer 22 is smaller than in the case where DC/DC conversion is not performed.

In view of this, the maximum operation point control unit 22e monitors electric power that is from the solar battery module 21 via the DC/DC conversion unit 22b. If the electric power that is output from the solar battery module 21 via the DC/DC conversion unit 22b is larger than a predetermined value, the second switching circuit 22f is turned on. Accordingly, an electric current flows from the first connection terminal 22a of the optimizer 22 to the positive terminal P of the solar battery module 21 without passing through the DC/DC conversion unit 22b.

As a result, loss in electric power in the DC/DC conversion unit 22b can be suppressed.

Note that, in an embodiment, the capacitors 33a and 34a and the bypasses 33b and 34b are provided outside of the optimizer 22, but may be provided inside the optimizer 22. In addition, as described above, if the magnitude of the impedance $Z_N$ is significantly small, an AC current flows from the second connection terminal 22c in the optimizer 22 to the negative terminal N of the solar battery module 21 via the optimizer 22, and thus the capacitor 34a and the negative terminal-side bypass 34b are not required.

Second Embodiment

One or more embodiments will be described with reference to FIGS. 7 and 8. Note that, for convenience of description, the same reference numerals are assigned to constituent members that have the same function as those described in the above embodiment, and the description thereof is omitted.

In the solar power generation system 1A of a first embodiment, one solar battery module 21 and one optimizer 22 are provided for one solar battery unit 20A. On the other hand, a solar power generation system 1B (the DC electric power system) of an embodiment is different from the solar power generation system 1A of a first embodiment in that an optimizer 22 is provided for each series connection of a plurality of solar battery cells 21b that constitute one solar battery module 21.

Configuration of Solar Power Generation System

Figure 7:
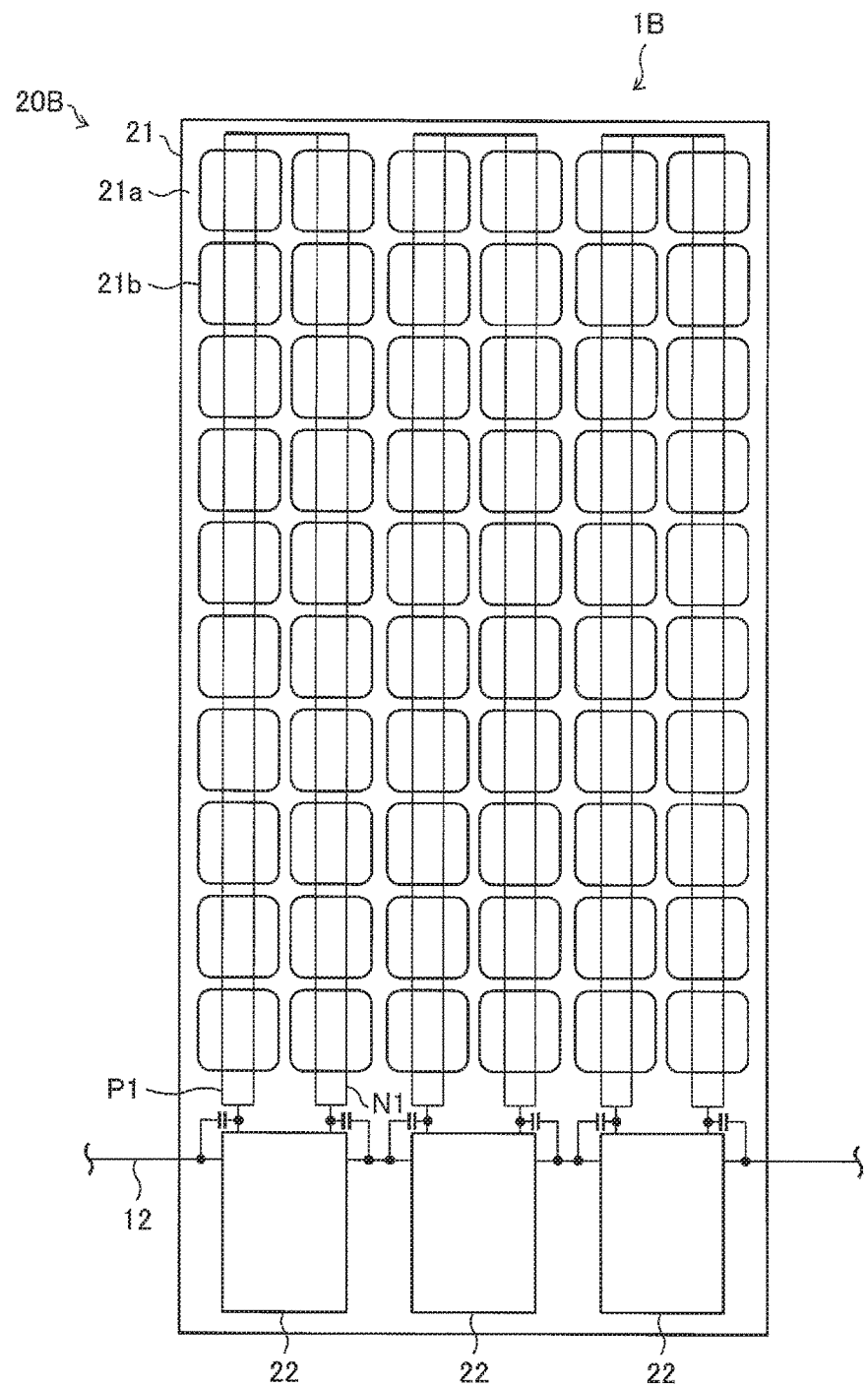
FIG. 7 is a schematic circuit diagram illustrating the configuration of a solar power generation system provided with an arc detection apparatus in a second embodiment.

FIG. 7 is a schematic circuit diagram showing the configuration of the solar power generation system 1B provided with an arc detection apparatus 30B of an embodiment. FIG. 8 is a circuit diagram showing the configuration of a main portion of the arc detection apparatus 30B.

As shown in FIG. 7, in the solar power generation system 1B of an embodiment, one solar battery unit 20B (a DC electric power source unit) has one solar battery module 21. Moreover, in the solar battery module 21, optimizers 22 are respectively provided for groups of solar battery cells 21b (DC electric power source modules) connected in series, and the optimizers 22 are connected in series via an electric path 12.

Specifically, in the solar battery module 21, each group of solar battery cells 21b connected in series is folded back at one end portion on a panel 21a so as to be arranged in two rows, and on the lower side of FIG. 7, solar battery cell positive terminals P1 and solar battery cell negative terminals N1 are provided as terminals for external connections. Accordingly, terminals of the optimizers 22 are connected to these solar battery cell positive terminals P1 and solar battery cell negative terminals N1. As a result, the solar battery unit 20B of an embodiment is constituted by individual optimizers 22 being connected to a plurality of solar battery cells 21b connected in series and the plurality of individual optimizers 22 being connected in series via the electric path 12.

Therefore, in the solar battery unit 20B of an embodiment, a circuit that can output maximum electric power for each group of solar battery cells 21b connected in series in the solar battery module 21 is provided. In addition, electric power that is output from the solar battery cells 21b connected in series is output to the electric path 12 that connects the optimizers 22 in series, and is used in the electric power system 14 via the PCS 13.

However, in the solar power generation system 1B provided with the solar battery unit 20B as described above, if an arc is generated in a group of solar battery cells 21b connected in series, an AC current does not flow to the electric path 12. Accordingly, the arc detection apparatus 30B cannot detect an AC current indicating generation of an arc, in the electric current sensor 31.

In view of this, in the arc detection apparatus 30B of an embodiment, similarly to the arc detection apparatus 30A of the above first embodiment, a bypass that directly connects the electric path 12 and a group of solar battery cells 21b connected in series is provided, and the bypass is provided with a capacitor.

Figure 8:
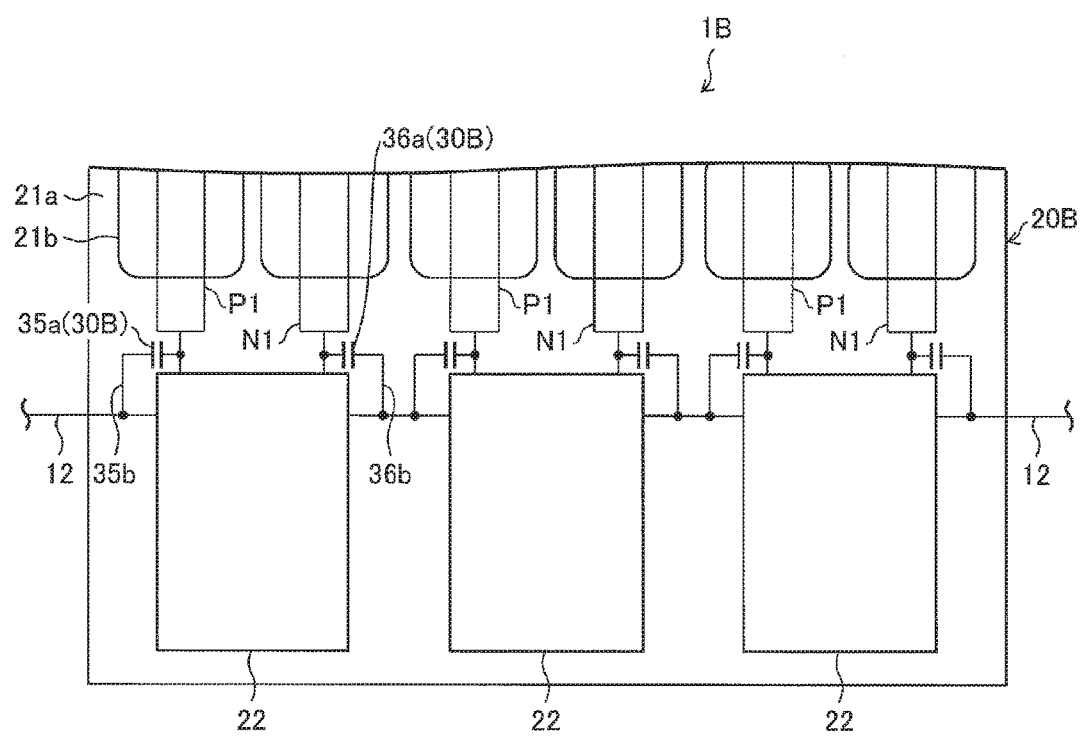
FIG. 8 is a circuit diagram illustrating the configuration of a main portion of an arc detection apparatus.

As shown in FIG. 8, specifically, a positive terminal-side bypass 35b having a capacitor 35a (the first capacitor) is provided between the electric path 12 on the input side of one optimizer 22 and the solar battery cell positive terminal P1, which is one extraction terminal of the group of solar battery cells 21b connected in series. Also, a negative terminal-side bypass 36b having a capacitor 36a (a second capacitor) is provided between the electric path 12 on the output side in the optimizer 22 and the solar battery cell negative terminal N1, which is the other extraction terminal of the group of solar battery cells 21b connected in series.

Accordingly, when an arc is generated in a portion of the groups of solar battery cells 21b connected in series in the solar battery module 21, an AC current flows to the positive terminal-side bypass 35b and the negative terminal-side bypass 36b, and thus the electric current sensor 31 interposed on the electric path 12 can detect the AC current. As a result, it become possible for the electric current sensor 31 to detect an arc generated in the solar battery module 21.

Note that configurations other than the above are the same as those of the solar power generation system 1A and the arc detection apparatus 30A of a first embodiment, and thus description thereof is omitted.

Note that, in an embodiment, the capacitors 35a and 36a and bypasses 35b and 36b are provided outside of the optimizer 22, but may be provided inside the optimizer 22. In addition, if the magnitude of the impedance $Z_N$ is significantly small, the capacitor 36a and the negative terminal-side bypass 36b are not required.

Third Embodiment

One or more embodiments will be described with reference to FIG. 9. Note that, for convenience of description, the same reference numerals are assigned to constituent members that have the same function as those described in the above embodiments, and the description thereof is omitted.

In the solar power generation system 1A of the above first embodiment, the number of solar battery strings 11 is one. On the other hand, in a solar power generation system 1C (the DC electric power system) of an embodiment is different from the solar power generation system 1A of the above first embodiment in that the solar power generation system 1C is constituted by a plurality of solar battery strings 11.

Configuration of Solar Power Generation System

Figure 9:
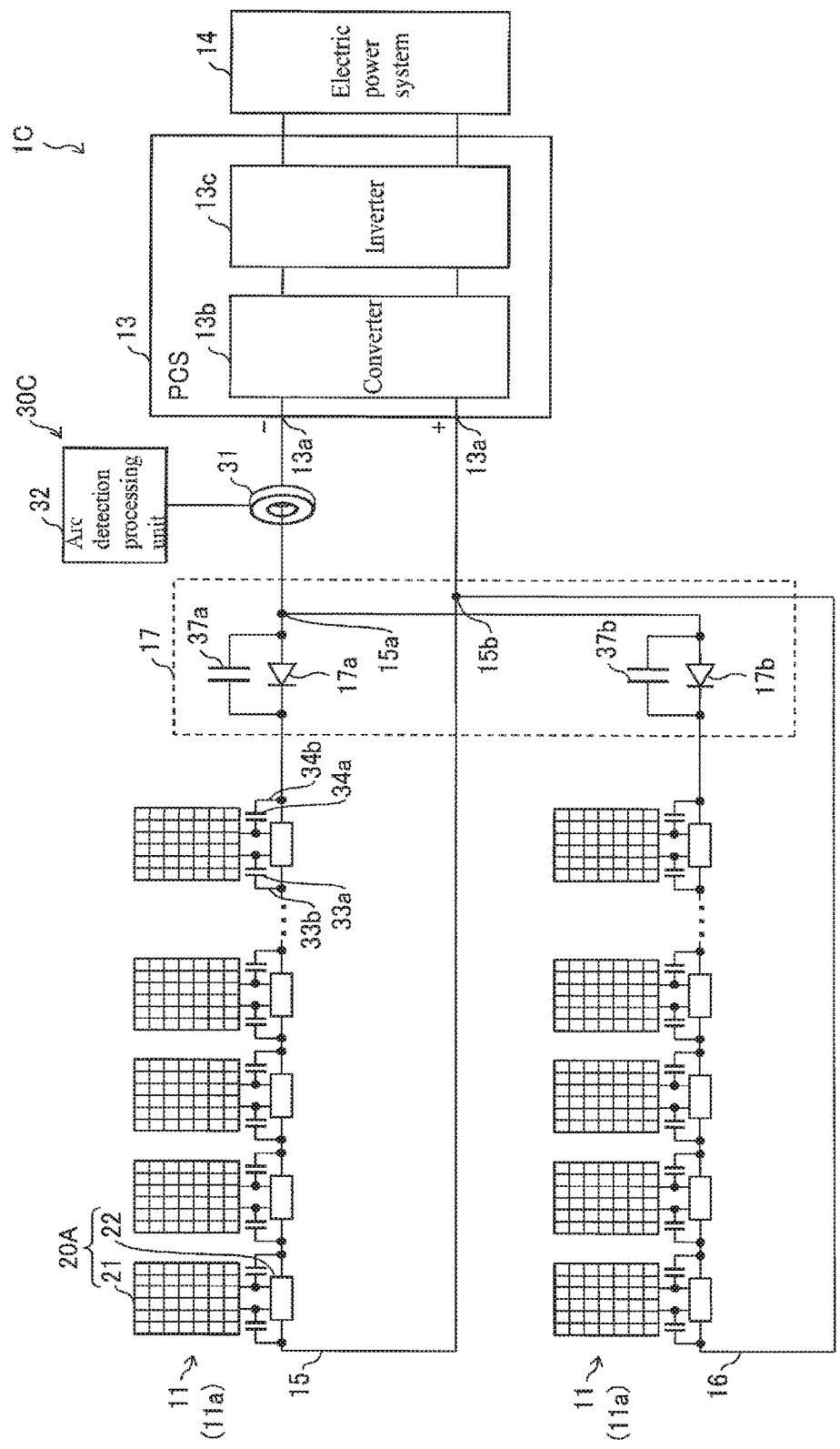
FIG. 9 a schematic circuit diagram showing the configuration of a solar power generation system provided with an arc detection apparatus in a third embodiment.

FIG. 9 is a block diagram showing the configuration the solar power generation system 1C of an embodiment.

As shown in FIG. 9, the solar power generation system 1C of an embodiment is provided with solar battery strings 11a and 11b respectively connected to electric paths 15 and 16, and is further provided with a connection box 17, a PCS 13, and an electric power system 14. As a result, the solar power generation system 1C of an embodiment is provided with the two solar battery strings 11a and 11b in parallel. Note that, in an embodiment, the number of solar battery strings 11a and 11b is two, but the present invention is not necessarily limited thereto, and the number of solar battery strings 11 of the solar power generation system 1C may be three or more.

The solar battery strings 11a and 11b of an embodiment are formed by connecting a large number of solar battery modules 21 in series respectively on the electric paths 15 and 16. Each of the solar battery modules 21 is provided with a plurality of solar battery cells connected in series, and is formed in a panel shape. One of the solar battery strings, namely, the solar battery string 11a is connected to the PCS 13 via the connection box 17 using the electric path 15. The other solar battery string, namely, the solar battery string 11b is connected to the electric path 16. In the solar power generation system 1C of an embodiment, the number of solar battery modules 21 connected to the one solar battery string 11a and the number of solar battery modules 21 connected to the other solar battery string 11b are the same, for example. However, numbers thereof do not necessarily need to be the same.

The electric path 16 is connected in parallel to the electric path 15 at a positive branch point 15a and a negative branch point 15b in the connection box 17.

In the connection box 17, reverse current preventing diodes 17a and 17b are respectively provided on the electric paths 15 and 16, and the reverse current preventing diodes 17a and 17b are connected in series to the corresponding solar battery strings 11a and 11b. That is, the reverse current preventing diode 17a is provided on the one solar battery string 11a side relative to the positive branch point 15a, on the electric path 15. Accordingly, an electric current is prevented from flowing in the opposite direction to an electric current supplied from the one solar battery string 11a. In addition, the reverse current preventing diode 17b is provided on the other solar battery string 11b side relative to the positive branch point 15a, on the electric path 16. Accordingly, an electric current is prevented from flowing in the opposite direction to an electric current supplied from the other solar battery string 11b.

Configuration of Arc Detection Apparatus

In the solar power generation system 1C of an embodiment, as shown in FIG. 9, an arc detection apparatus 30C is provided with one electric current sensor 31, and this electric current sensor 31 is provided between the connection box 17 and the PCS 13 on the electric path 15. Accordingly, an arc (a series arc) generated in one of the solar battery strings 11a and 11b can be detected.

Operations of Arc Detection Apparatus

Operations of the arc detection apparatus 30C regarding a parallel arc in the connection box 17 in the solar power generation system 1C of an embodiment will be described below. Note that a parallel arc refers to an arc generated between a pair of electric paths 15 connected from the solar battery string 11 to the connection box 17.

For example, a case is considered in which a parallel arc is generated in one of the one solar battery string 11a or the other solar battery string 11b, and the reverse current preventing diodes 17a and 17b enter a reverse bias state. Specifically, for example, if a parallel arc is generated in the one solar battery string 11a, and an output voltage of the one solar battery string 11a falls below an output voltage of the other solar battery string 11b, the reverse current preventing diode 17a enters a reverse bias state.

In this case, if a capacitor 37a is not connected in parallel to the reverse current preventing diode 17a, the AC current of the parallel arc generated in the one solar battery string 11a is blocked by the reverse current preventing diode 17a. As a result, the electric current sensor 31 cannot measure the AC current of the parallel arc.

On the other hand, in an embodiment, capacitors 37a and 37b are respectively connected in parallel to the reverse current preventing diodes 17a and 17b. These capacitors 37a and 37b function as one constituent element serving as the arc detection apparatus 30C.

The capacitor 37a is connected in parallel to the reverse current preventing diode 17a, and forms a bypass current path for the reverse current preventing diode 17a. In addition, the capacitor 37b is connected in parallel to the reverse current preventing diode 17b, and forms a bypass current path for the reverse current preventing diode 17b.

As a result, an AC current of the parallel arc flows through the capacitors 37a and 37b, and the electric current sensor 31 can measure the AC current of the parallel arc. Therefore, the arc detection apparatus 30C can detect generation of a parallel arc in the one solar battery string 11a or the other solar battery string 11b.

As described above, in the solar power generation system 1C of an embodiment, the capacitor 37a is connected in parallel to the reverse current preventing diode 17a, and thus even if the reverse current preventing diode 17a is in a reverse bias state, the AC current of a parallel arc generated in the one solar battery string 11a flows via the capacitor 37a. Therefore, the electric current sensor 31 can measure an AC current that is based on a parallel arc. Accordingly, the arc detection apparatus 30C can detect a parallel arc generated in the one solar battery string 11a.

Note that, in the arc detection apparatus 30C of the solar power generation system 1C of an embodiment, for example, one electric current sensor 31 is provided between the connection box 17 and the PCS 13 on the electric path 15 in order to detect an arc (a series arc or a parallel arc).

However, the position of the electric current sensor 31 and the number of electric current sensors 31 are not necessarily limited thereto.

For example, on both the electric paths 15 and 16, it is possible to respectively provide electric current sensors 31 between the solar battery module 21 and the connection box 17 or on a bypass current path on which the capacitors 37a and 37b are provided. Accordingly, a parallel arc generated in the electric paths 15 and 16 can be detected.

Fourth Embodiment

One or more embodiments will be described with reference to FIG. 10. Note that, for convenience of description, the same reference numerals are assigned to constituent members that have the same function as those described in the above embodiments, and the description thereof is omitted.

Figure 10:
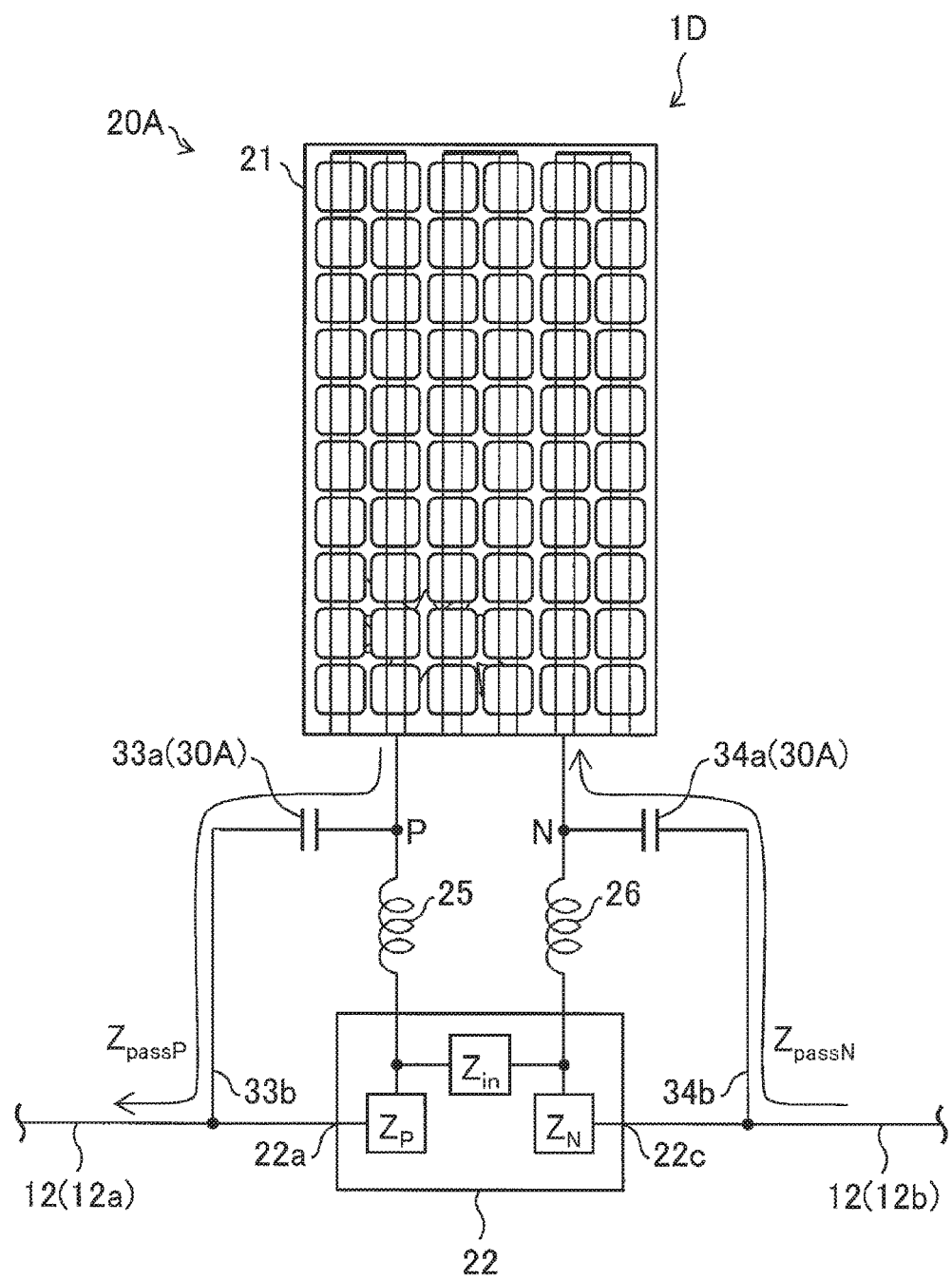
FIG. 10 is a circuit diagram illustrating an arc detection apparatus in a fourth embodiment, and shows a main portion of the arc detection apparatus.

FIG. 10 is a circuit diagram showing an arc detection apparatus in a solar power generation system according to an embodiment, and shows a main portion of the arc detection apparatus. As shown in FIG. 10, a solar power generation system 1D (the DC electric power system) of an embodiment is different from the solar power generation system 1A of a first embodiment in that a coil 25 (a first coil) is added between an optimizer 22 and a positive terminal P of a solar battery module 21, namely, one end portion of a capacitor 33a, and a coil 26 (a second coil) is added between the optimizer 22 and a negative terminal N of the solar battery module 21, namely, one end portion of a capacitor 34a, and other configurations are similar.

By adding the coils 25 and 26, the amount of AC current that flows from the positive terminal P to the negative terminal N via the coil 25, an impedance $Z_{in}$, and the coil 26 decreases, while the amount of AC current that flows to a positive terminal-side bypass 33b, the optimizer 22, an electric path 12, a PCS 13, and a negative terminal-side bypass 34b increases, and the amount of AC current that flows through an electric current sensor 31 increases. As a result, generation of an arc can be detected accurately.

Note that the coils 25 and 26 may be incorporated in the optimizer 22. In addition, as described above, if the capacitor 34a is omitted, the coil 26 may be omitted. In addition, the coils 25 and 26 may also be added similarly in the solar power generation system 1B of a second embodiment and the solar power generation system 1C of a third embodiment.

Supplementary Information

Note that in the above embodiments, one or more aspects are applied to a solar power generation system, but there is no limitation thereto, and one or more aspects can be applied to any power supply system provided with a DC power source. Examples of such a DC power source include a fuel cell apparatus that can acquire electrical energy (direct current power) by electrochemical reaction between hydrogen fuel and oxygen in the air using hydrogen fuel, a storage battery for accumulating electrical energy, an electricity storage device such as a capacitor, and the like, in addition to a solar power generation apparatus.

The present invention is not limited to the above-described embodiments, and various modifications can be made thereto within the scope laid out in the claims Embodiments achieved by combining the technical means disclosed in different embodiments as appropriate also fall within the technical scope of the present invention.

The invention claimed is:

1. An arc detection apparatus that is applied to a DC electric power system,
   the DC electric power system comprising:
      a load apparatus that consumes or converts DC electric power that is input to an input terminal of the load apparatus;
      an electric path connected to the input terminal of the load apparatus; and
      a DC electric power source string in which a plurality of DC electric power source units are connected in series, the DC electric power source units each having a DC electric power source module that generates electric power or performs charging/discharging and an optimizer circuit that optimizes an output voltage of the DC electric power source module by configuring the DC electric power source string such that electric power of the DC electric power source module is maintained at a predetermined threshold or more, and supplies the optimized output voltage to the electric path,
   the arc detection apparatus comprising:
      a first capacitor comprising a first bypass current path, the first capacitor comprising one end portion connected to one output terminal of the DC electric power source module, and an other end portion connected to a portion of the electric path connected to one output terminal of the optimizer circuit;
      an electric current sensor that measures an electric current on the electric path between the DC electric power source string and the load apparatus; and
      a processor configured to perform operations comprising operation as an arc determination unit that determines whether an arc is generated, based on a high frequency component of an AC current measured by the electric current sensor, wherein
      an impedance of the first capacitor satisfies a condition that a combined impedance of the impedance of the first capacitor and an impedance of the optimizer circuit between one input terminal of the optimizer circuit and the one output terminal of the optimizer circuit is smaller than an impedance of the optimizer circuit between input terminals of the optimizer circuit.

2. The arc detection apparatus according to claim 1, further comprising
   a first coil between the one end portion of the first capacitor and the one input terminal of the optimizer circuit.

3. The arc detection apparatus according to claim 2, further comprising
   a second capacitor comprising one end portion connected to an other output terminal of the DC electric power source module, and an other end portion connected to an other output terminal of the optimizer circuit.

4. The arc detection apparatus according to claim 1, further comprising
   a second capacitor comprising a second bypass current path, the second capacitor comprising one end portion connected to an other output terminal of the DC electric power source module, and an other end portion connected to an other output terminal of the optimizer circuit.

5. The arc detection apparatus according to claim 4,
wherein impedances of the first capacitor and the second capacitor satisfy a condition that a combined impedance of the impedances of the first capacitor and the second capacitor, the impedance of the optimizer circuit between the one input terminal of the optimizer circuit and the one output terminal of the optimizer circuit, and an impedance of the optimizer circuit between an other input terminal of the optimizer circuit and the other output terminal of the optimizer circuit is smaller than the impedance of the optimizer circuit between the input terminals of the optimizer circuit.

6. The arc detection apparatus according to claim 4, further comprising
a second coil between the one end portion of the second capacitor and an other input terminal of the optimizer circuit.

7. The arc detection apparatus according to claim 1, further comprising
a first coil between the one end portion of the first capacitor and the one input terminal of the optimizer circuit.

8. The arc detection apparatus according to claim 1, further comprising
a second capacitor comprising one end portion connected to an other output terminal of the DC electric power source module, and an other end portion connected to an other output terminal of the optimizer circuit.

9. The arc detection apparatus according to claim 7, further comprising
a second capacitor comprising one end portion connected to an other output terminal of the DC electric power source module, and an other end portion connected to an other output terminal of the optimizer circuit.

* * * * *